(12) United States Patent
Ikeda et al.

(10) Patent No.: US 6,749,013 B2
(45) Date of Patent: *Jun. 15, 2004

(54) HEAT SINK

(75) Inventors: Masami Ikeda, Tokyo (JP); Yuichi Kimura, Tokyo (JP)

(73) Assignee: The Furukawa Electric Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 447 days.

(21) Appl. No.: 09/403,674

(22) PCT Filed: Dec. 25, 1998

(86) PCT No.: PCT/JP98/05890

§ 371 (c)(1),
(2), (4) Date: Aug. 12, 1999

(87) PCT Pub. No.: WO99/34438

PCT Pub. Date: Jul. 8, 1999

(65) Prior Publication Data

US 2001/0025701 A1 Oct. 4, 2001

(30) Foreign Application Priority Data

Dec. 25, 1997 (JP) .............................. 9-355923

(51) Int. Cl.⁷ .............................................. F28D 15/00
(52) U.S. Cl. ................................ 165/104.26; 165/80.4; 165/104.33; 165/185
(58) Field of Search .................... 165/104.33, 80.3, 165/104.26, 185, 104.21

(56) References Cited

U.S. PATENT DOCUMENTS

| | | | | |
|---|---|---|---|---|
| 3,209,062 A | * | 9/1965 | Scholz ................ | 165/104.21 |
| 3,270,250 A | * | 8/1966 | Davis ................ | 165/104.21 |
| 5,358,032 A | * | 10/1994 | Arai et al. ............ | 165/185 X |
| 5,427,174 A | * | 6/1995 | Lomolino, Sr. et al. ............ | 165/104.26 |
| 5,465,782 A | * | 11/1995 | Sun et al. ............ | 165/104.26 |
| 5,490,558 A | * | 2/1996 | Akachi ................ | 165/185 X |
| 5,694,295 A | * | 12/1997 | Mochizuki et al. .... | 165/104.33 |
| 5,720,338 A | * | 2/1998 | Larson et al. ....... | 165/104.26 X |
| 5,725,049 A | * | 3/1998 | Swanson et al. ....... | 165/104.26 |
| 5,937,936 A | * | 8/1999 | Furukawa et al. ..... | 165/104.26 |
| 5,998,863 A | * | 12/1999 | Kobayashi et al. .... | 165/104.33 |
| 6,082,443 A | * | 7/2000 | Yamamoto et al. .... | 165/104.33 |
| 6,158,502 A | * | 12/2000 | Thomas ................ | 165/104.26 |
| 6,167,948 B1 | * | 1/2001 | Thomas ................ | 165/104.26 |

FOREIGN PATENT DOCUMENTS

| | | | | |
|---|---|---|---|---|
| GB | 1402509 | * | 8/1975 | ............ 165/104.26 |
| JP | 0096992 | * | 6/1983 | ............ 165/104.33 |
| JP | 0083587 | * | 4/1988 | ............ 165/104.26 |
| JP | 5-315482 | | 11/1993 | |
| JP | 406137775 | * | 5/1994 | ............ 165/104.33 |
| JP | 7-30025 | | 1/1995 | |
| JP | 7-112032 | | 11/1995 | |
| SU | 495522 | * | 12/1975 | ............ 165/104.26 |
| SU | 0559099 | * | 5/1977 | ............ 165/104.26 |
| SU | 001768915 | * | 10/1992 | ............ 165/104.26 |

OTHER PUBLICATIONS

Connors et al., Flat–Type Heat p;pes, IBM, pp. 675–676, Aug. 1975.*

* cited by examiner

Primary Examiner—Christopher Atkinson
(74) Attorney, Agent, or Firm—Cantor Colburn LLP

(57) ABSTRACT

A heat sink comprising (a) a plate-shaped heat pipe including an upper plate member and a lower plate member to form a hermetically sealed cavity, and a working fluid enclosed therein, and (b) at least one heat radiating fin integrally formed with the upper plate member on an outer surface of the upper plate member.

10 Claims, 5 Drawing Sheets

(a)

(b)

HEAT SINK

BACKGROUND OF THE INVENTION

1. Field of the Invention

The present invention relates to a heat sink which may be adapted for use in a heat dissipation of an electronic equipment and the like having a heat generating part which needs to be cooled.

2. Related Art

In recent years, an electronic element such as a semiconductor device and the like to be mounted on various electronic or electric equipment such as a personal computer and the like has been densely integrated, the output thereof has become large, and an amount of heat generated therefrom has increased. It has become an important technical problem which is to be solved to cool such an electronic equipment having heat generating parts, and the improvement in such cooling techniques attracts people's attention. As a method for preventing the heat generating electric element (hereinafter referred to as "heat generating part") from being overheated, there is known a method of lowering the temperature of the air inside the body encasing the electronic equipment by a fan attached thereto so as to discharge the air and cool the heat generating part, or a method of cooling the heat generating part by a cooling member which is attaching to the heat generating part and removes heat from the heat generating part.

The cooling member which is attached to the heat generating part is generally called as a heat sink, and is often used in the form of a plate member made of a material being excellent in thermal conductivity such as copper, aluminum and the like. In order to efficiently discharge the heat which is transferred from the heat generating part to the plate member as the cooling member, heat radiating fins are often integrally formed with the plate member. In addition, there is also an embodiment in which a heat pipe is attached to the above-mentioned plate member to transfer the heat from the plate member to a prescribed place, and furthermore, heat radiating fins are attached to the portion in the prescribed place which is separated from the heat generating part, thus transferring the heat and then dissipating therefrom the transferred heat.

In addition, in order to improve the uniformity in heat absorption of the plate member, a heat pipe is sometimes attached to or buried in the plate member. Improvement of the uniformity in heat absorption of the plate member makes it possible to more efficiently absorb the heat generated by the heat generating part.

A heat pipe which has been used up to now is briefly described. The heat pipe includes a container having a hermetically sealed cavity and a working fluid enclosed in the container. The heat pipe has generally a heat absorption (i.e., evaporator) side and a heat radiation (i.e., condenser) side. The heat pipe has a function of moving heat from the evaporator side to the condenser side by means of a phase transformation of the working fluid enclosed in the cavity from a gaseous phase to a liquid phase or from a liquid phase to a gaseous phase, and the movement of thus phase-transformed working fluid inside the cavity.

More specifically, in the heat absorption side of the heat pipe, the working fluid enclosed inside the hermetically sealed cavity is evaporated by the heat thermally transferred from the heat generating part through the material of the container forming the heat pipe, and the vapor of the working fluid which has been transformed in phase passes through the inside of the cavity and moves to the condenser side of the heat pipe. In the condenser side, the vapor of the working fluid is cooled and returns to the liquid phase. The working fluid which has returned to the liquid phase flows back to the evaporator side. As described above, movement of heat is performed by a phase transformation and movement of the phase-transformed working fluid. In order to make it easy to transform the working fluid in phase, the cavity is degassed and hermetically sealed.

Since a cooling structure (i.e., cooling device) in which the cooling member is attached to the heat generating part, and heat radiating fins are further attached to the cooling member can efficiently cool the heat generating part, although it is comparatively small in size, the cooling structure is expected to be an effective cooling means.

In recent years, a marked tendency may be seen to make small in size various kinds of electronic equipment having semiconductor devices which need to be cooled. Accordingly, there is a trend to restrict the space in which the cooling structure used for cooling the part is to be installed.

In order to realize a small-sized (space-saving) cooling structure, it is necessary to realize a more efficient heat dissipating means. Moreover, since an amount of heat generated by an electronic equipment has increased, it is required to develop a cooling structure capable of effectively dissipating a large amount of heat. Such a cooling structure has not yet been proposed.

SUMMARY OF THE INVENTION

An object of the present invention is to provide a cooling structure which is compact, however, simultaneously can realize an excellent cooling performance, and furthermore, can dissipate a large amount of heat.

The present invention has been made in order to attain the above-mentioned object. According to the present invention, there is proposed a first embodiment of a heat sink comprising;

(a) a plate-shaped heat pipe including an upper plate member and a lower plate member to form a hermetically sealed cavity, and a working fluid enclosed therein, and (b) at least one heat radiating fin integrally formed with said upper plate member on an outer surface of said upper plate member.

According to the present invention, there is proposed a second embodiment of a heat sink, wherein a heat transferring metal column for joining said upper plate member and said lower plate member with each other in said cavity of said heat sink is integrally formed with said lower plate member on a portion corresponding to a heat absorbing portion of said plate-shaped heat pipe.

According to the present invention, there is proposed a third embodiment of a heat sink, wherein a total area of side wall portion of said heat transferring metal column is larger than a sectional area of said heat transferring metal column.

According to the present invention, there is proposed a fourth embodiment of a heat sink, wherein at least one pressure resisting metal part is integrally formed with said upper plate member and/or said lower plate member in said cavity of said heat sink.

According to the present invention, there is proposed a fifth embodiment of a heat sink, wherein each of said heat radiating fin and said pressure resisting metal part comprises at least two portions or a single portion, and said at least two portions are intermittently arranged in a radial manner, whereas said single portion is continuously arranged in a radial manner.

According to the present invention, there is proposed a sixth embodiment of a heat sink, wherein each of said heat radiating fin and said pressure resisting metal part comprises at least two portions or a single portion, and said at least two portions are intermittently arranged in a shape of a swirl, whereas said single portion is continuously arranged in a shape of a swirl.

According to the present invention, there is proposed a seventh embodiment of a heat sink, wherein a wick is disposed in said cavity of said heat pipe.

According to the present invention, there is proposed a eighth embodiment of a heat sink, wherein an electrically driven fan is disposed at a location facing said heat radiating fin.

DETAILED DESCRIPTION OF THE PREFERRED EMBODIMENTS

Figure 1:
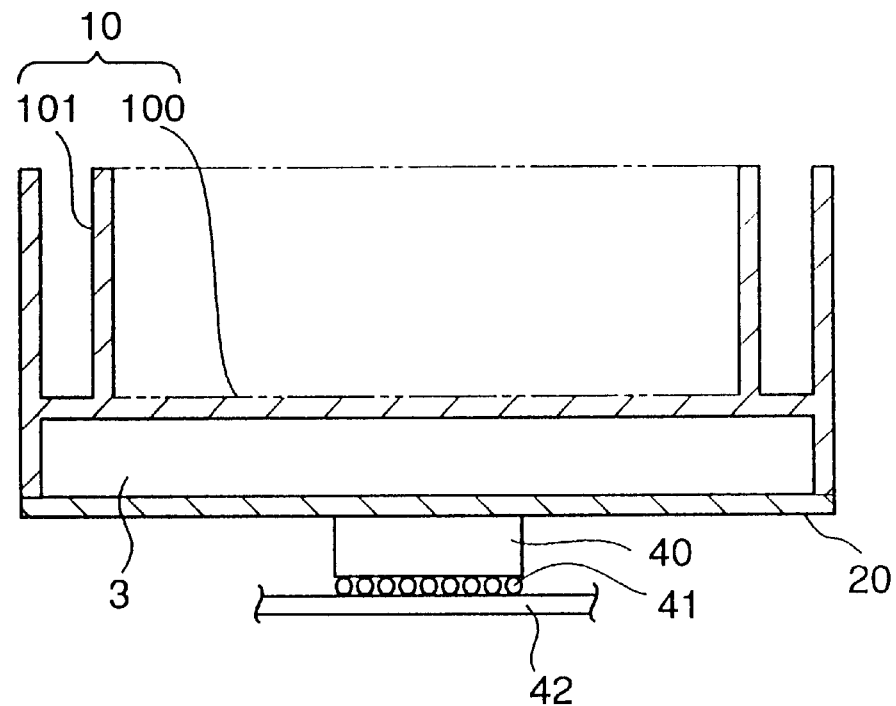
FIG. 1 is a schematic sectional view for explaining an example of a heat sink of the present invention.

FIG. 1 is a schematic sectional view for explaining an embodiment of a heat sink of the present invention.

A heat generating part 40 which is an electronic equipment to be cooled is set on an outer surface of a lower plate member 20 of a heat sink 1 of the present invention. The heat sink 1 includes a heat pipe structure having a hermetically sealed cavity 3 therein. As shown in FIG. 1, the cavity 3 of the heat pipe is formed by joining the lower plate member 20 to an upper plate member 10 which is integrally formed in one body with a container part 100 and a heat radiating fin part 101 (namely, formed as a unit by means of casting or the like instead of joining the respective portions to one another). The upper plate member 10 and the lower plate member 20 are joined to each other by means of a joining method of brazing, welding, soldering or the like. A working fluid is enclosed in the cavity 3. Illustration of a working fluid is omitted. In FIG. 1, the reference numeral 41 represents a lead and the reference numeral 42 represents a printed wiring board.

The heat generated from the heat generating part 40 is transferred through the lower plate member 20 to the working fluid enclosed in the cavity of the heat pipe. The heat thus transferred to the working fluid spreads out all over the heat sink uniformly in heat transfer due to a fact that the heat sink of the present invention includes the heat pipe structure, as described above. The heat is further transferred to the heat radiating fins 101 and discharged to the outside in the air. In such a way, the heat generated by the heat generating part 40 is quickly discharged to the outside so as to cool the heat generating part 40.

The upper plate member 10 which is one of the components forming the heat sink 1 of the present invention comprises a container portion 100 and a heat radiating fin portion 101. Since the container portion 100 and the heat radiating fin portion 101 are integrally formed as a unit, a thermal resistance between those portions is low. Accordingly, the heat transferred through the cavity 3 is quickly transferred to the heat radiating fin portion 101. As a result, an excellent cooling performance may be realized. It is preferable to apply such metal material as an aluminum or copper being excellent in thermal conductivity as a material for the upper plate member.

Furthermore, a heat sink of the present invention whose upper plate member and fin are integrally formed as a unit is less expensive in fabricating cost in comparison with a heat sink assembled by joining a separate heat generating fin part to a plate-shaped heat pipe. The upper plate member 10 may be less expensively manufactured by means of a casting or forging method. In the present invention, a heat sink may be manufactured by forming a plate-shaped heat pipe, and then joining thus formed plate-shaped heat pipe with a heat generating fin part (namely, the respective components may be joined to one another).

Figure 2:
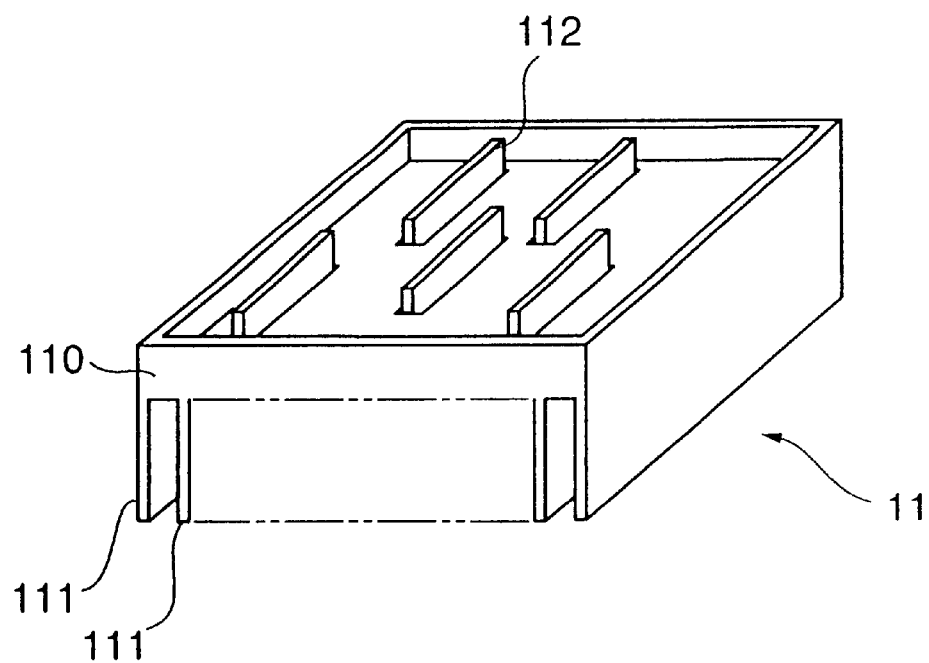
FIG. 2 is a schematic perspective view for explaining an example of an upper plate member of a heat sink of the present invention.

FIG. 2 is a schematic perspective view showing an embodiment of an upper plate member which is a component of a heat sink of the present invention. FIG. 2 shows the upper plate member in an upside-down state in order to show more apparently its structure. The upper plate member 11 shown in FIG. 2 is obtained by integrally forming as a unit a container portion 110 and a heat radiating fin portion 111 and additionally a pressure resisting metal column 112. The pressure resisting metal column 112 is arranged inside of a cavity of a heat pipe. The pressure resisting metal column 112 is also joined to a lower plate member (not shown) at the time of forming a heat sink by joining the lower plate member to this upper plate member 11. By forming the pressure resisting metal column 112 in such a way, even if the inner pressure of the cavity rises with the operation (evaporation) of a working fluid, the heat sink may not distort in shape, thus increasing the strength of the heat sink.

Figure 3:
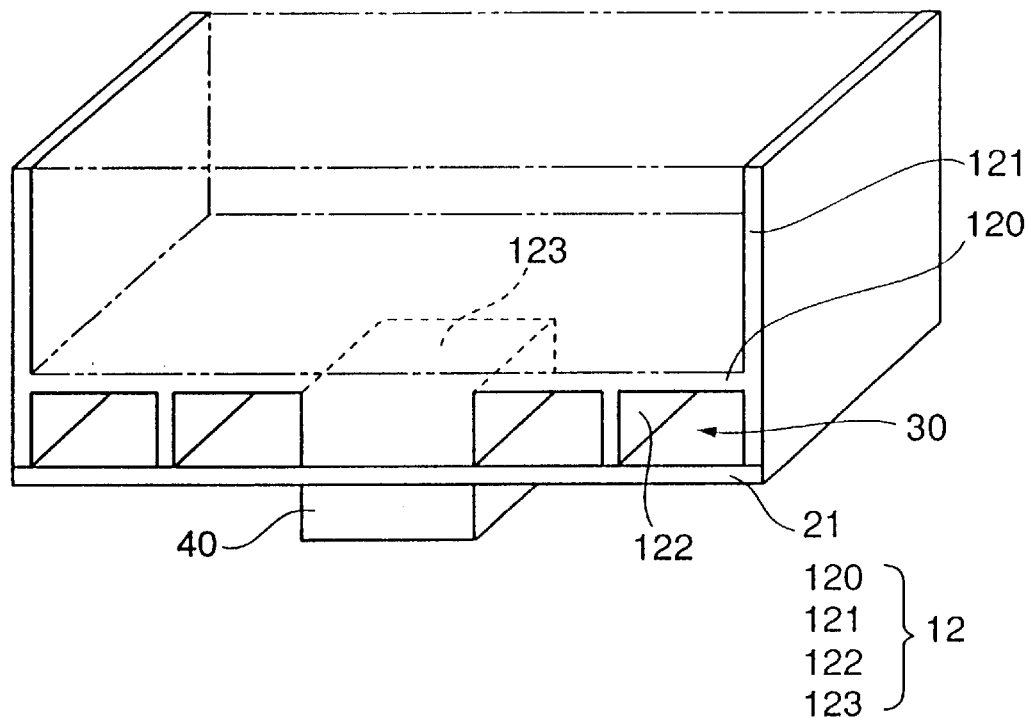
FIG. 3 is a schematic perspective view., partially in cross section, for explaining another example of a heat sink of the present invention.

FIG. 3 shows another embodiment of a heat sink of the present invention.

FIG. 3 shows a perspective view of a heat sink in which a heat transferring metal column 123 is disposed. The heat transferring metal column 123 is disposed on a portion (namely, a heat absorbing portion) in the cavity corresponding to a heat generating part which is set on the outer surface of the lower plate member. In this example, the heat transferring metal column 123 is integrally formed as a unit with the upper plate member 12 together with a container portion 120, a heat radiating fin portion 121 and a pressure resisting metal column 122. Reference numeral 30 in FIG. 3 represents a cavity.

As shown in FIG. 3, the heat transferring metal column 123 is provided in the cavity at the inner surface of the lower plate member (i.e., the heat absorbing part), on the outer surface of which the heat generating part 40 is to be set. Since the heat generating part 40 is attached to the heat transferring metal column 123 through the lower plate member, the heat generated from the heat generating part 40 is transferred to the heat transferring metal column, and then transferred through each side wall of the heat transferring metal column 123 to the working fluid, thus enabling to enlarge the evaporating area of the heat pipe. As a result, the heat transfer efficiency is remarkably improved.

Figure 8:
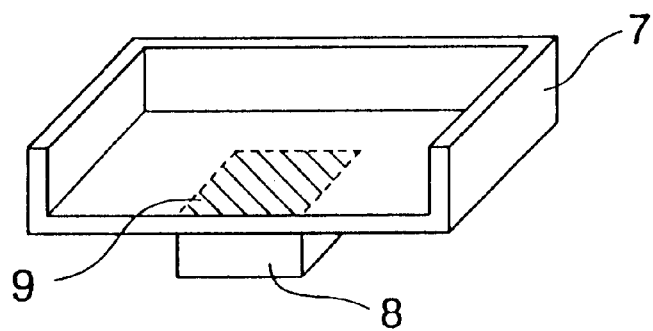
FIG. 8 is a schematic view for explaining evaporation areas in comparison with each other in case that there is a heat transferring metal column and in case that there is no heat transferring metal column.
Figure 8:
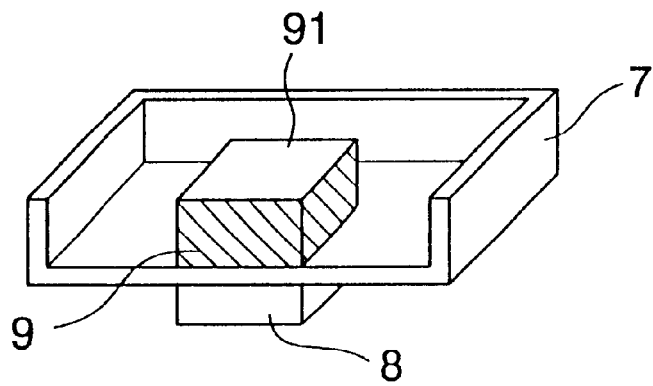

FIG. 8 shows the evaporating areas in comparison with each other in case that no heat transferring metal column is disposed and in case that the heat transferring metal column is disposed. In FIG. 8(a), since no heat transferring metal column is provided, the evaporating area in the heat pipe is restricted to only a portion being in contact with the upper face of the heat generating part (the portion is shown by slant lines). On the other hand, as shown in FIG. 8(b), in case that a heat transferring metal column is provided, since the heat generating part 8 is in contact with the heat transferring metal column 91, all the four side walls (which are shown by slant lines) of the heat transferring metal column become the evaporating area.

In the example shown in FIG. 8(b), since the heat transferring metal column is integrally formed as a unit with the (not shown) upper plate member, the heat transferring metal column may be provided in such manner that the total areas of the four side walls becomes larger than the sectional area of the heat transferring metal column. Furthermore, since the heat generated from the heat generating part may be transferred through the heat transferring metal column itself to the upper plate member by the thermal conductivity of the heat transferring metal column, it is possible to reduce the thermal resistance of the heat pipe. As the result, a heat sink having a small thermal resistance can be obtained.

In addition, particularly in case that the generated heat density of the heat generating part is high, there may occur a state where there exists no working liquid in the evaporating part of the heat pipe, namely, what is called a dry-out phenomenon in which the working fluid dries out by the transferred heat. If the heat transferring metal column is provided, as described above according to the heat sink of the present invention, since the heat generated from the heat generating part is transmitted in the vertical direction of the heat transferring metal column through the lower plate member in such manner that the heat transferring metal column is uniformly heated as a whole by the transferred heat, the generated heat density can be lowered along side faces (walls) of the heat transferring metal column. More specifically, the transferred heat is spread out along the side walls of the heat transferring metal column, thus lowering the generated heat density. According to the present invention, it is therefore possible to fabricate a heat sink including a heat pipe in which no dry-out phenomenon occurs.

In the example shown in this figure, the heat transferring metal column 123 has nearly the same cross sectional area as that of the heat generating part 40, but the size is not limited to this. The heat transferring metal column 123 may be joined with the lower plate member 21 or may be integrally formed as a unit with the lower plate member 21. In this case the heat of the heat generating part 40 is efficiently transferred to the heat transferring metal column 123.

Moreover, in case that a wick is provided inside the heat pipe, the thermal resistance in the heat pipe may be reduced by cohering the wick and the heat transferring metal column to each other. A heat transfer mechanism in this case is as follows. The heat generated from the heat generating part is firstly transferred to the heat transferring metal column through the lower plate member and then, transferred to the wick cohered closely to the heat transferring metal column, and then, transferred to the working fluid. In general, since porous or piled meshed materials are used for a wick in order to enhance a capillary operation of the wick, the evaporation area may be further enlarged.

As a material for the heat transferring metal column, metal material such as an aluminum or copper excellent in thermal conductivity is preferable, which is the same material as that of the heat pipe container, so as to be more adaptive to the working liquid. As described above, the heat transferring metal column is integrally formed as a unit with the upper plate member. In this case the heat transferring metal column and the lower plate member are joined with each other by means of such a joining method as brazing, welding, soldering and the like. The heat transferring metal column may be integrally formed as a unit with the lower plate member. In this case the heat transferring metal column and the upper plate member are joined with each other by means of such a joining method as brazing, welding, soldering and the like.

Figure 4:
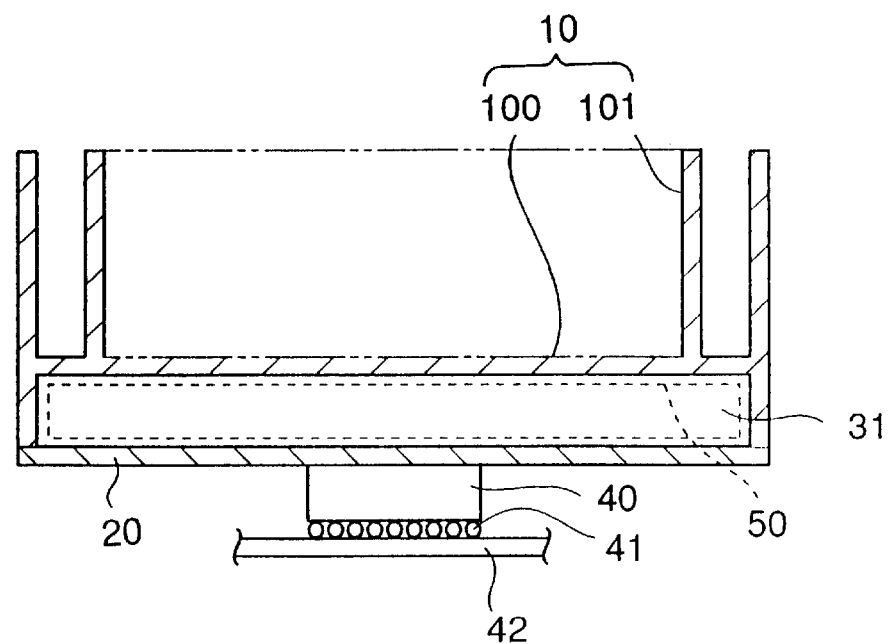
FIG. 4 is a schematic sectional view for explaining another example of a heat sink of the present invention.

FIG. 4 shows a heat sink of the present invention further provided with a wick 50 comprising such as a mesh and the like inside a cavity 31 along the interior surface of the container of the heat sink 1 shown in FIG. 1.

Figure 5:
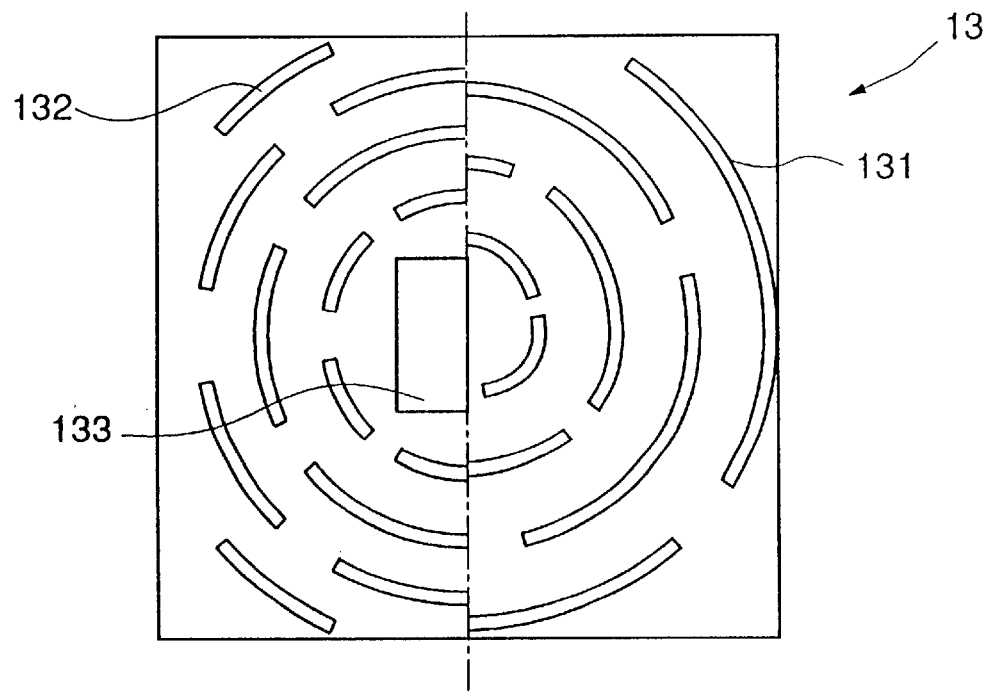
FIG. 5 is a schematic view for explaining another example of an upper plate member of a heat sink of the present invention.

FIG. 5 is a plan view showing another embodiment of the upper plate member. The left half of FIG. 5 shows the inside of a cavity. The right half of FIG. 5 shows the outside of the cavity. This upper plate member 13 has heat radiating fins 131, pressure resisting metal parts 132 and a heat transferring metal column 133 all of which are integrally formed as a unit with the upper plate member. Therefore, the thermal resistance between them is small. In the embodiment shown in FIG. 5, the heat radiating fins 131 comprise a plurality of portions arranged intermittently in the shape of a swirl. In addition, in the same way the pressure resisting metal parts 132 comprise a plurality of portions arranged intermittently in the shape of a swirl.

Figure 6:
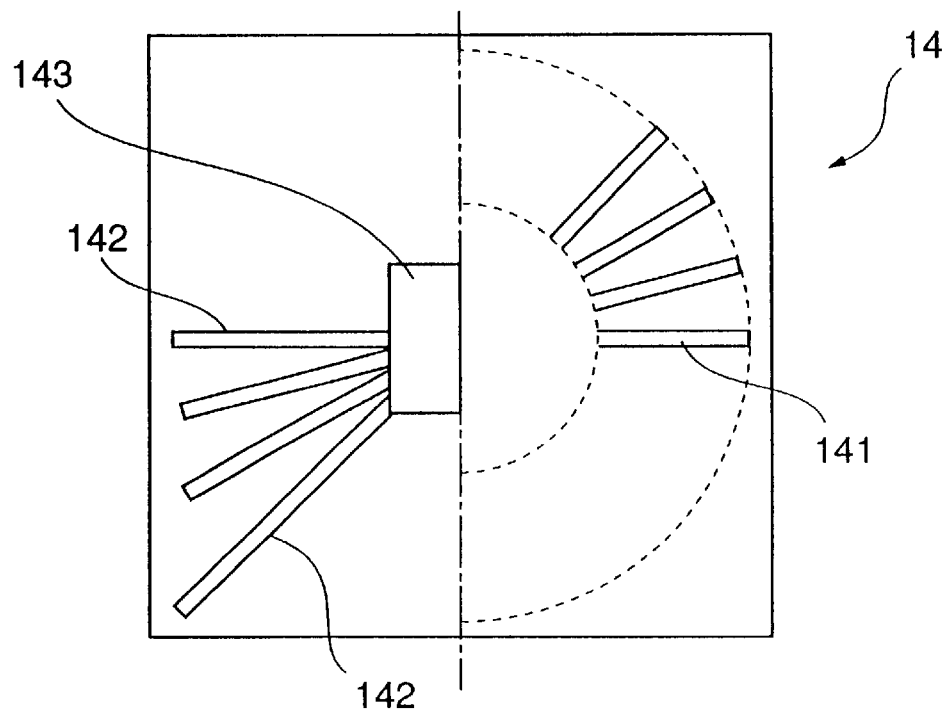
FIG. 6 is a schematic view for explaining another example of an upper plate member of a heat sink of the present invention.

FIG. 6 is a plan view showing another embodiment of the upper plate member. The left half of FIG. 6 shows the inside of a cavity. The right half of FIG. 6 shows the outside of the cavity. This upper plate member 14 has heat radiating fins 141, pressure resisting metal part 142 and a heat transfer ring metal column 143 all of which are integrally formed as a unit with the upper plate member. In this embodiment, the heat radiating fins 141 comprise a plurality of portions arranged in a radial manner with the heat transferring metal column 143 disposed nearly as the center of the radial. In the same way, the pressure resisting parts 142 comprise a plurality of portions arranged in a radial manner with the heat transferring metal column 143 disposed nearly as the center of the radial.

Figure 7:
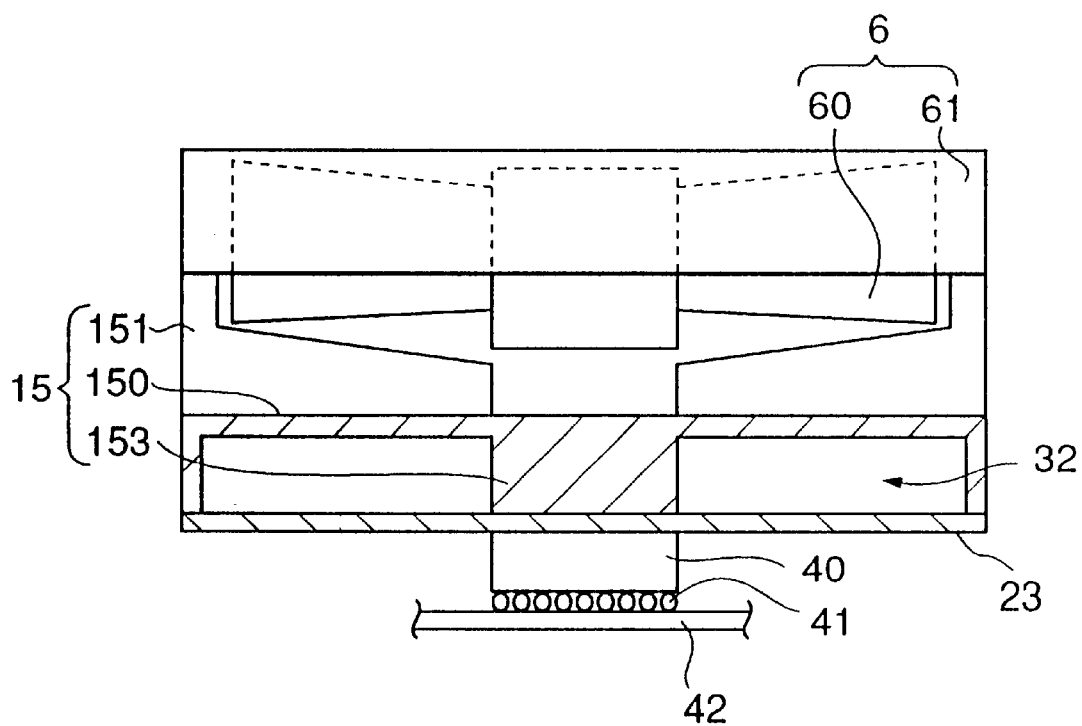
FIG. 7 is a schematic sectional view for explaining another example of a heat sink of the present invention.

FIG. 7 shows an embodiment of a heat sink further provided with an electrically driven fan. FIG. 7 is similar to the above-mentioned embodiments of a heat sink of the present invention in a feature that a cavity 32 is formed by joining a lower plate member 23 and an upper plate member 15 to each other, and in a feature that a container 150, heat radiating fins 151 and a heat transferring metal column 153 are integrally formed as a unit with the upper plate member 15.

The heat sink of FIG. 7 is further provided with an electrically driven fan 6 being opposite to the heat radiating fins 151. In FIG. 7, the reference numeral 60 is a fan blade and the reference numeral 61 is a fan cabinet. An air current generated by rotation of the fan blade 60 strikes the heat radiating fins 151 and the container 150 to more forcefully prompt the discharge of heat. The heat radiating fins 151 comprise a plurality of portions arranged in a radial manner similarly to the example shown in FIG. 6. By doing so, a wind sent from the electrically driven fan 6 comes to efficiently blow the heat radiating fins 151.

As described above, a heat sink of the present invention shown in the several embodiments has an advantage that it has a small number of components and is easy to make compact in size. And it is also excellent in cooling performance. In the present invention, the fins and the heat pipe do not necessarily need to be metallurgically joined with each other but may be attached with each other thermally in one body through grease.

EXAMPLES

Example 1

A heat sink provided with a cavity was formed by joining to each other, by means of a brazing method, a lower plate member of aluminum of 1 mm in thickness, 80 mm in width and 80 mm in length and an upper plate member 15 of aluminum of 38 mm in height, 80 mm in width and 80 mm in length in which a heat transferring metal column, fins and pressure resisting metal part were integrally formed as a unit. A part of the upper plate member forming the side wall portion of the cavity was 5 mm in height. The heat transferring metal column was 25 mm in length, 25 mm in width and 4 mm in height, and was positioned in the middle part of the upper plate member. The fins comprised the portions arranged each other in radial, each being 27 mm in width, 33 mm in height and 1 mm in thickness.

The upper plate member having the integrally formed heat transferring metal column, the fins and the pressure resisting metal part as a unit was manufactured by casting aluminum. Moreover, a wick was provided all over the inner walls of the cavity and the side faces of the heat transferring metal column.

Thus formed heat sink was attached to a CPU of 25 mm in length and 25 mm in width which is a heat generating part. The heat sink of the present invention efficiently cooled the CPU having a high amount of generating heat of 70 W.

Example 2

A heat sink provided with a cavity was formed by joining to each other, by means of a brazing method in the same way as described above, a lower plate member of aluminum of 1 mm in thickness, 80 mm in width and 120 mm in length and an upper plate member 15 of aluminum of 30 mm in height, 80 mm in width and 120 mm in length in which a heat transferring metal column, fins and pressure resisting metal part were integrally formed as a unit. A part of the upper plate member forming the side wall portion of the cavity was 6 mm in height. The heat transferring metal column was 20 mm in length, 15 mm in width and 5 mm in height, and was positioned in the middle part of the upper plate member. The fins comprised the portions arranged each other, each being 80 mm in width, 24 mm in height and 0.8 mm in thickness. The upper plate member having the integrally formed heat transferring metal column, the fins and the pressure resisting metal part as a unit was manufactured by casting aluminum.

Thus formed heat sink was attached to a chip which is a heat generating part. The heat sink of the invention efficiently cooled the chip having a high amount of generating heat of 100 W.

Example 3

A heat sink provided with a cavity was formed by joining to each other, by means of a brazing method, a lower plate member of aluminum of 0.6 mm in thickness, 100 mm in width and 100 mm in length and an upper plate member 15 of aluminum of 26 mm in thickness, 100 mm in width and 100 mm in length in which a heat transferring metal column, fins and pressure resisting metal part were integrally formed as a unit. A part of the upper plate member forming the side wall portion of the cavity was 4 mm in height. The fins comprised the portions arranged each other, each being 100 mm in width, 24 mm in height and 0.8 mm in thickness. Additionally, a wick was provided all over the inner walls of the cavity. The upper plate member having the integrally formed fins and the pressure resisting metal part as a unit was manufactured by casting aluminum.

Thus formed heat sink of the invention was attached to an MCM which was a heat generating part. The heat sink efficiently cooled the MCM which was a chip locally having a high amount of generating heat. As is clear from the foregoing, according to the present invention, it is possible to obtain a small-sized heat sink which is capable of cooling the heat generating part with a high amount of generating heat and is excellent in cooling performance.

As described above in detail, a heat sink of the present invention is of a small size and excellent in cooling performance. Furthermore, a heat sink of the present invention may cool a heat generating part with a high amount of generating heat.

What is claimed is:

1. A heat sink comprising:
   a plate-shaped heat pipe including an upper plate member and a lower plate member to form a hermetically sealed cavity, and a working fluid enclosed therein;
   at least one heat radiating fin integrally formed with said upper plate member;
   at least cue pressure resisting column disposed in said cavity; and
   at least one heat transferring metal column integrally formed with said upper plate member for spreading heat generated from a heat generating part, said heat transferring metal column having substantially a same cross sectional area as that of said heat generating part which is to be attached to an outer surface of said lower plate member, and being disposed in said cavity on a portion corresponding to said heat generating part.

2. A heat sink as claimed in claim 1, wherein said heat transferring metal column is integrally formed with said lower plate member.

3. A heat sink as claimed in claim 1, wherein said at least one pressure resisting column is integrally formed with said upper plate member and/or said lower plate member.

4. A heat sink as claimed in claim 1, wherein each of said heat radiating fin and said pressure resisting metal column part comprises at least two portions or a single portion, and said at least two portions are intermittently arranged in a radial manner, whereas said single portion is continuously arranged in a radial manner.

5. A heat sink as claimed in claim 1, wherein each of said heat radiating fin and said pressure resisting metal column part comprises at least two portions or a single portion, and said at least two portions are intermittently arranged in a shape of a swirl, whereas said single portion is continuously arranged in a shape of a swirl.

6. A heat sink as claimed in claim 4, further comprising a wick disposed in said cavity of said heat pipe.

7. A heat sink as claimed in claim 5, further comprising a wick disposed in said cavity of said heat pipe.

8. A heat sink as claimed in claim 6, further comprising an electrically driven fan disposed at a location facing said heat radiating fin.

9. A heat sink according to claim 7, further comprising an electrically driven fan disposed at a location facing said heat radiating fin.

10. A heat sink as claimed in claim 1, wherein said at least one pressure resisting column is metal.

* * * * *